Figure 1:
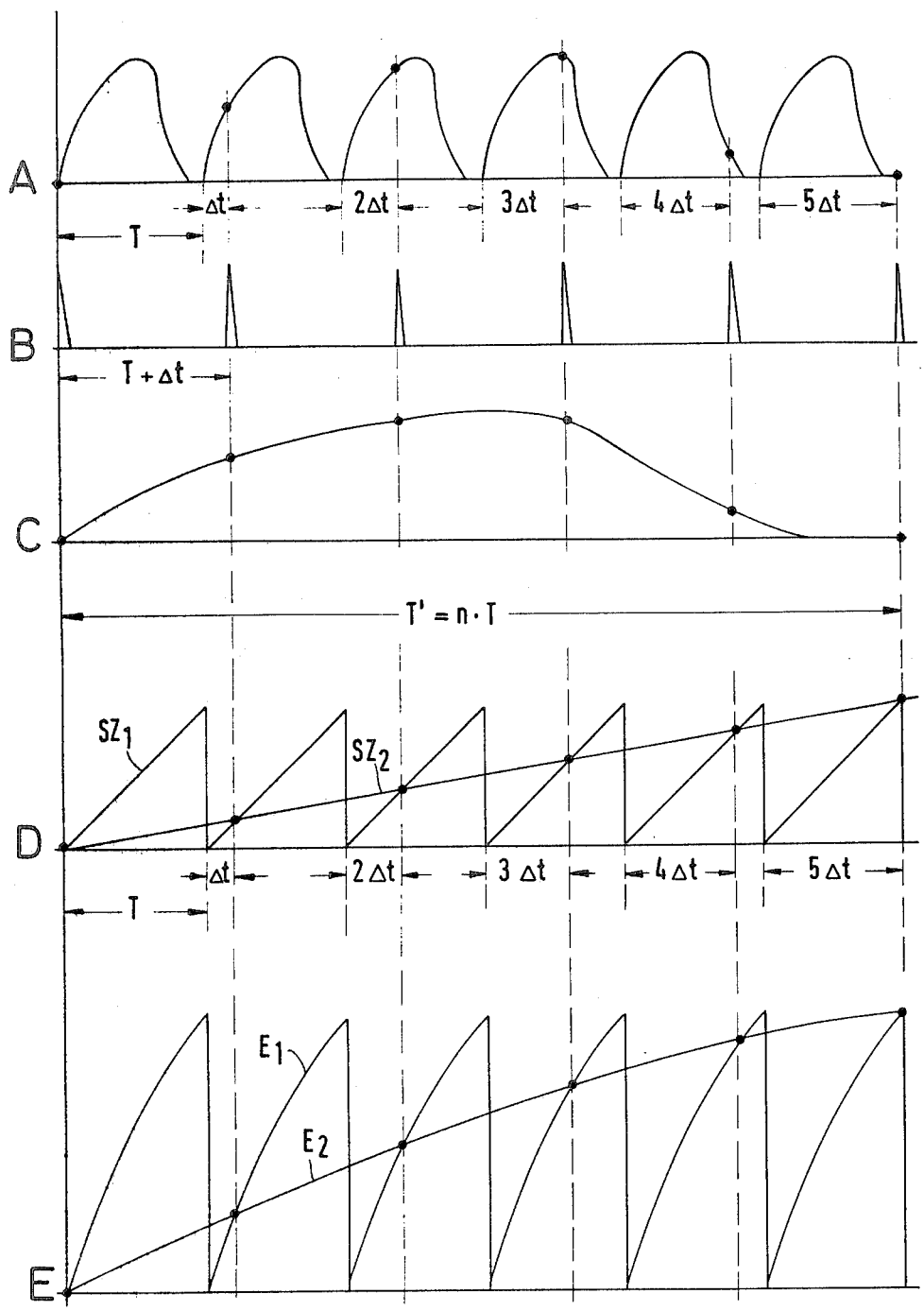

United States Patent [19]

Sartorius et al.

[11] 4,251,777

[45] Feb. 17, 1981

[54] METHOD OF AND APPARATUS FOR TIME-STABILIZATION OF SAMPLING PULSES

[75] Inventors: Wilfried Sartorius, Steinen; Don J. R. Stock, Schopfheim-Langenau, both of Fed. Rep. of Germany

[73] Assignee: Endress u. Hauser GmbH u. Co., Maulburg, Fed. Rep. of Germany

[21] Appl. No.: 944,169

[22] Filed: Sep. 20, 1978

[30] Foreign Application Priority Data

Sep. 27, 1977 [DE] Fed. Rep. of Germany ....... 2743410

[51] Int. Cl.$^3$ .......................... H03K 5/13; H03K 5/22
[52] U.S. Cl. ...................................... 328/155; 328/55
[58] Field of Search .................. 328/155, 151, 56, 55; 324/121, 120; 315/377

[56] References Cited
U.S. PATENT DOCUMENTS 3,293,555 12/1966 Mazure et al. ...................... 328/155

*Primary Examiner*—Alfred E. Smith
*Assistant Examiner*—Thomas P. O'Hare
*Attorney, Agent, or Firm*—Gerald J. Ferguson, Jr.; Joseph J. Baker

[57] ABSTRACT

A method and a circuit arrangement for time stabilization of scanning pulses for the stroboscopic sampling of periodically recurring signals. Stroboscopic sampling is performed by means of scanning pulses having a repetition period slightly different from the period of the recurring signals to be scanned. The signals to be scanned are transmitted over a transmission line in which a measuring section of known length is defined by the distance between two tapping points to each of which a sampling circuit is connected. The signals transmitted over the transmission line are sampled stroboscopically by means of the scanning pulses whereby time-transformed signals are obtained. These time-transformed signals are separated by a time interval corresponding to the transit time of the signals in the measuring section multiplied by the time-transformation factor. The number of scans occurring in this time-interval is counted and compared with a given desired number; if there is a difference between the two compared numbers, the scanning pulse period is changed so as to eliminate this difference. In an alternative embodiment, the measuring section is defined by a transmission line section of different characteristic impedance, and the recurrent signals are sampled at a single tapping point ahead of this transmission line section; in this case the time-interval corresponding to the transit time is determined by means of the reflexions occurring at the impedance breaks.

13 Claims, 6 Drawing Figures

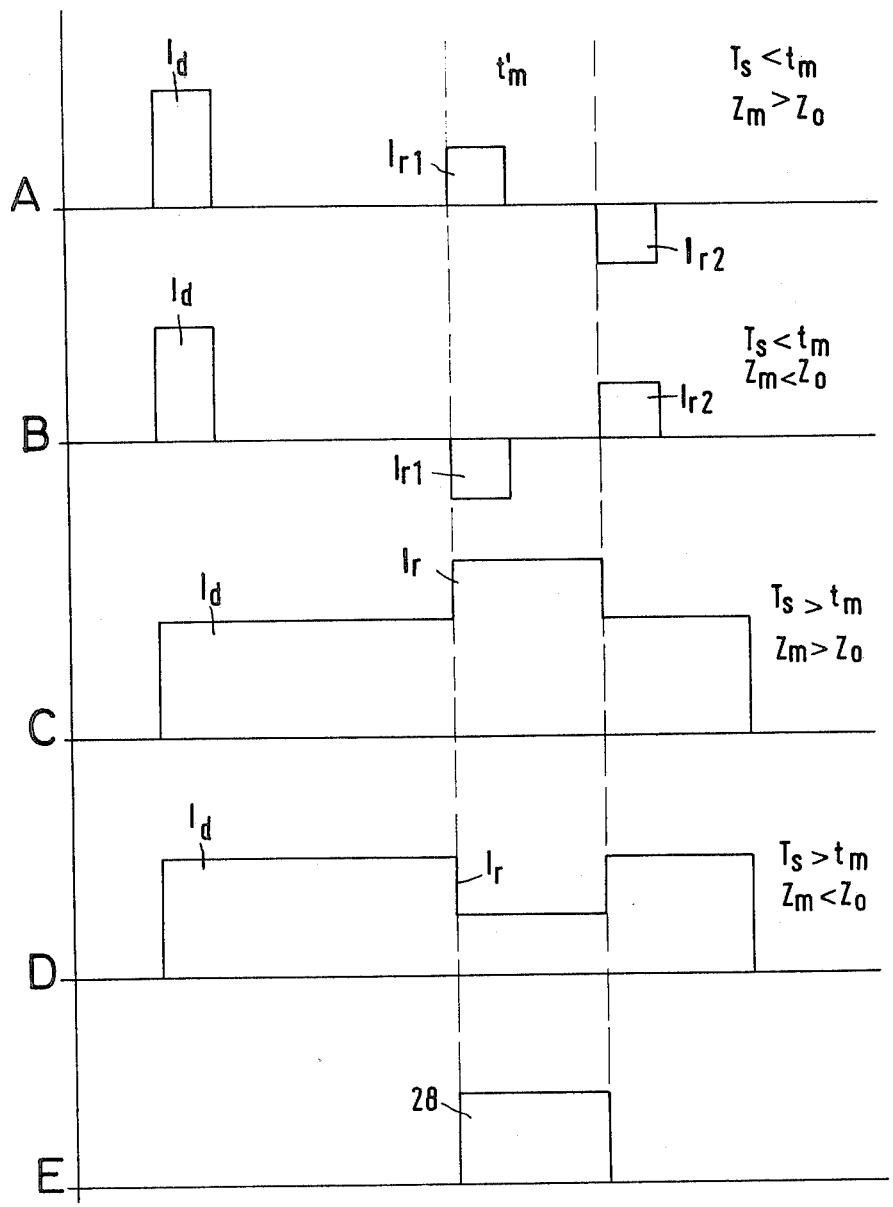

METHOD OF AND APPARATUS FOR TIME-STABILIZATION OF SAMPLING PULSES

The invention refers to a method of the kind specified in the preamble to claim 1 as well as to arrangements for the performance of the method.

Stroboscopy is a method which has been known for an already long time and successfully applied for making rapid mechanical processes visible by 'time-expansion' so that details of the progress may be studied. An electronic variant upon stroboscopy is the scanning method (in Anglo-American terminology designated as the 'sampling' method). It is applied primarily with cathode ray oscillographs in order to make periodically recurring signals visible, the repetition rate of which is higher than the highest deflection frequency of the oscillograph. For this purpose the signal to be displayed is scanned in successive periods in each case by scanning pulses the period of which is slightly greater than the signal period (or than a multiple of the signal period). Thus from each period of the recurrent signal a single scanning value is derived, the scanning instants in relation to the start of the signal period being slightly offset from one another. The scanning values derived one after another are displayed in the course of a single deflection of the spot of light on the oscillograph, and their succession yields an image of one period of the perdically recurring signal, but with a time-expansion which corresponds with the number of scanning pulses employed for the reproduction of one signal period. There production is not indeed effected continuously, but in the form of a curve changing in steps, yet the image is the more accurate the greater the number of scanning pulses employed for the reproduction and thus the smaller the difference in time between the signal period and the scanning pulse period. At the same time the time-expansion is also the greater, the smaller this difference in time. If, for example, for scanning one complete signal curve, 10,000 scanning pulses are employed in one scanning cycle the image of the curve reproduced on the screen consists of 10,000 scanning values which are derived from 10,000 successive periods of the signal; the reproduction is then effected with a time-expansion of 10,000:1. The period of these scanning pulses must be greater by 1/10,000 than the signal period.

The problem therefore exists of generating pulses the progressive period of which differs by an accurately determined very small difference in time from a very short predetermined period. The differences in time between the signal period and the scanning pulse period applied in practice are of the order of magnitude of picoseconds. Every deviation of the time difference from the desired value has the result that the scanning of the signal period is effected by a correspondingly smaller or greater number of scanning pulses and consequently the duration of the signal image is greater or smaller by a corresponding number of signal periods. The scale of the image or the time transformation factor thus alters in dependence upon oscillations in the time difference between the signal period and the scanning pulse period.

If all that matters is the reproduction of the wave shape of the signal, alterations in the scale of the image are of secondary importance. If on the contrary time measurements are to be performed upon the time-transformed signal image, the time transformation factor must be stabilized with the necessary accuracy.

Stabilization of the time transformation factor means that the scanning pulse period or more accurately the difference in time between the scanning pulse period and the signal period, must be kept to a constant value. The fullfilment of this requirement runs up against considerable technical difficulties because the measurement and regulation of such short times is not possible or is possible only with very great outlay.

The object of the invention is the creation of a method by which in a simple way and with low outlay satisfactory stabilization of the scanning pulse period is possible, as well as of arrangements for the performance of the method.

With the method in accordance with the invention the time measurement necessary to the regulation of the scanning pulse period is effected not of the very short signals to be regulated but of the time-expanded signals obtained by scanning, where as the standard of time the transit time of the signals over a measuring section of known length is applied. For the time measurement the fact is made use of that the section of the signal period corresponding with the traverse of the measuring section in the case of a predetermined scanning pulse period corresponds with an accurately determinable number of scannings in the time expanded signal. By counting the scannings coming in this section and comparison with the desired value it can therefore be established whether the scanning pulse period has the predetermined value or not. The counting can be effected in a simple way because signals are present in the system, which as regards number correspond with the scannings, particularly the scanning pulses themselves, or else the timing signals employed for their generation, or finally even the signals to be scanned. Since these signals in comparison with the differences in time to be regulated have a relatively large period and the measuring time interval because of the time expansion is greater by a multiple than the true transit time of the signals over the measuring section, relatively simple electronic circuits may be employed for the time measurement, the counting and the comparison; in particular available integrated counting and comparison circuits may be employed.

A preferred embodiment of an arrangement for the performance of the method in accordance with the invention is characterized as follows. In the case of this embodiment two scanning circuits are needed, the points of connection of which to the transmission line define the measuring section. The time measuring arrangement can in this case be made particularly simply because it only needs to establish the time interval between two signals present at separate inputs.

In the case of another embodiment of the arrangement, only one scanning circuit is needed and use is made of reflections of the signals at the input and output of a measuring section inserted in the line. In this case the time measuring arrangement must be made in such a way that it can establish the time interval between the reflections caused by the input and output of the measuring section.

Figure 2:
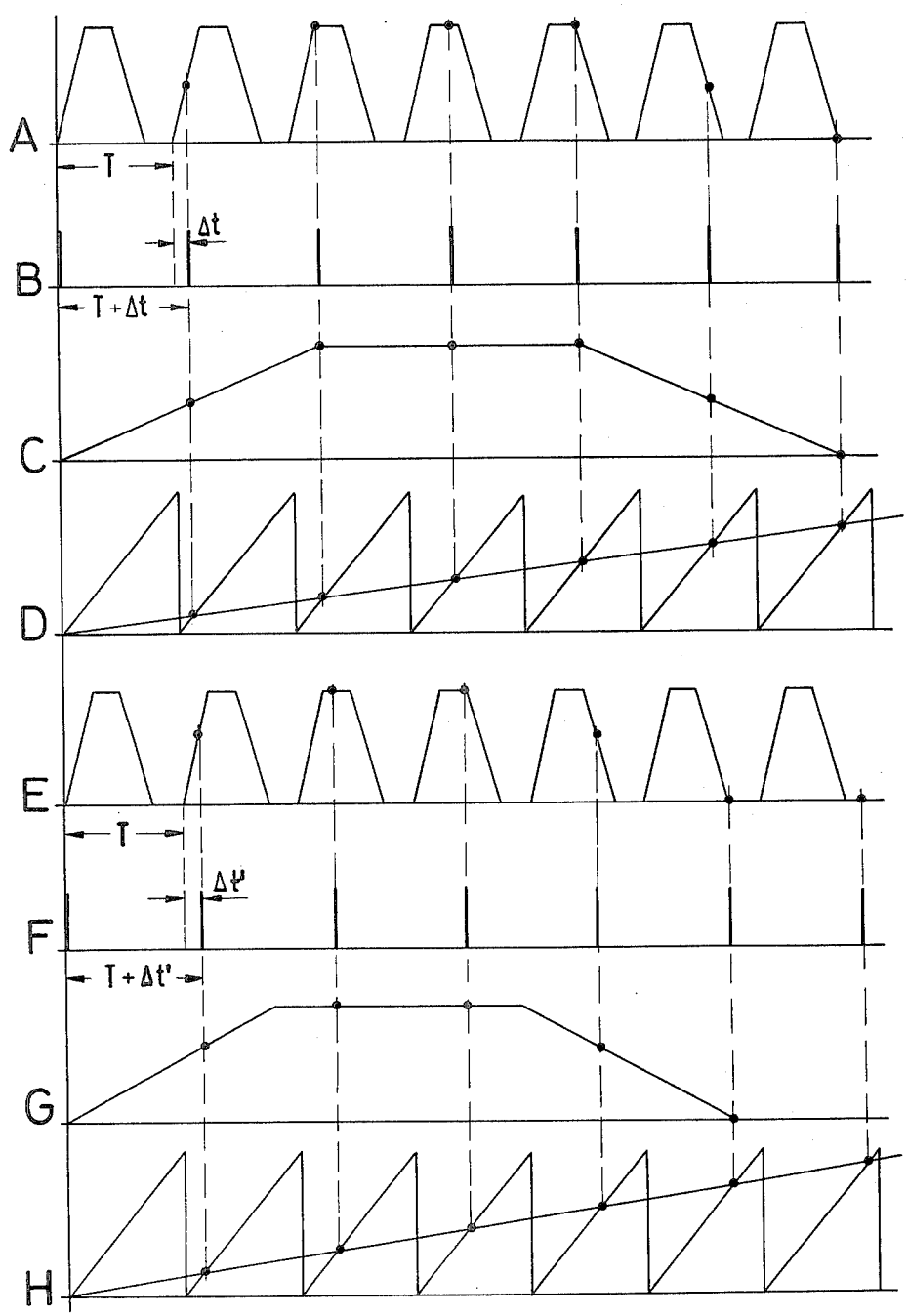
Figure 3:
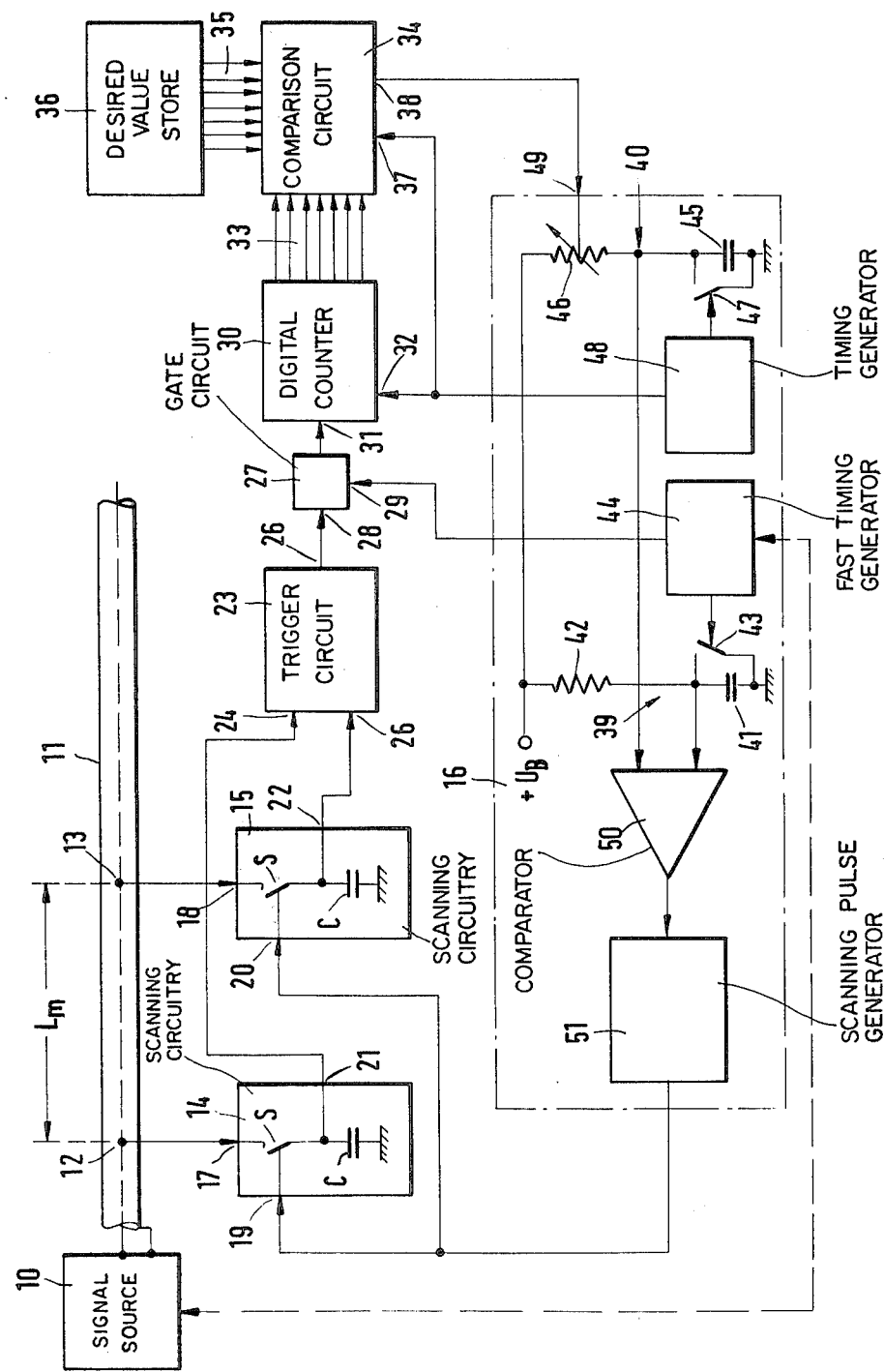
Figure 4:
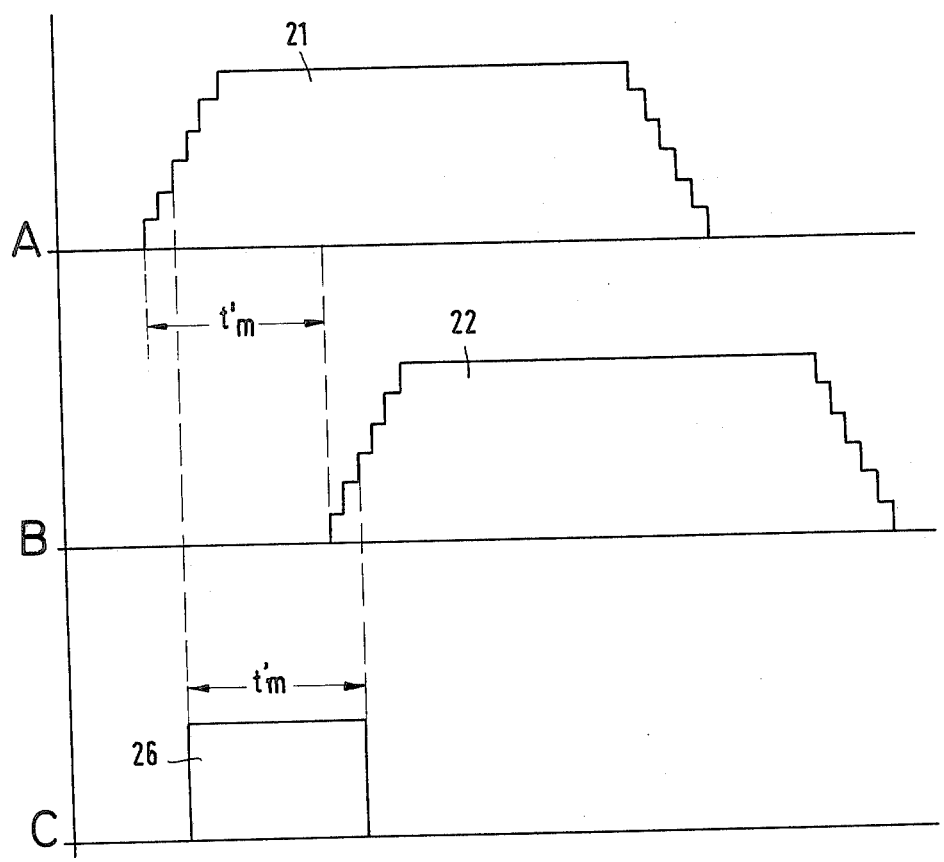
Figure 5:
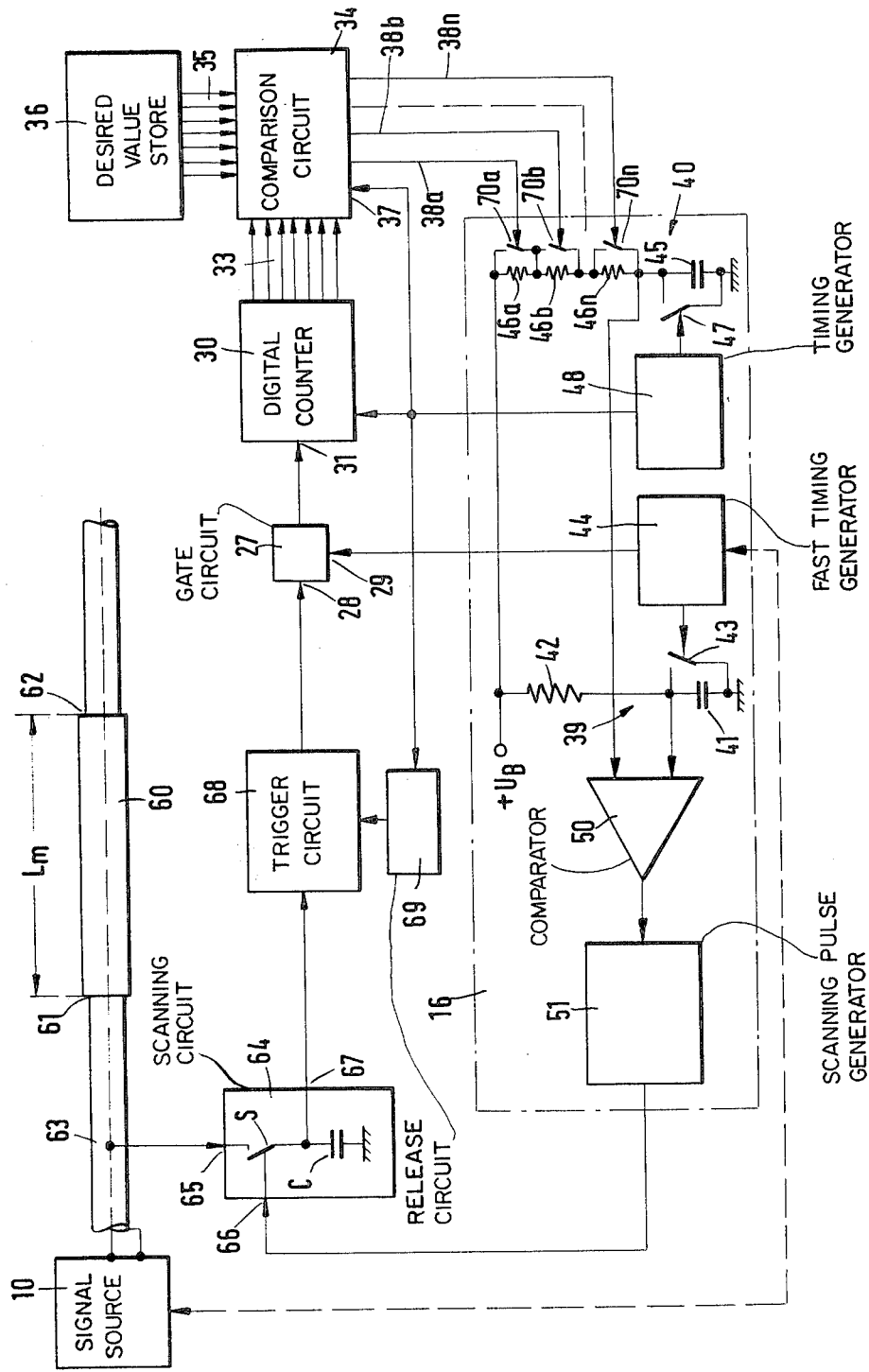

Further features and advantages of the invention follow with the aid of the drawing from the description below of embodiments. In the drawing there is shown in:

FIG. 1 graphs against time for explanation of the principle of electronic stroboscopic scanning;

FIG. 2 graphs against time for explanation of the effect of alterations in the difference in time between the signal period and the scanning pulse period;

FIG. 3 the diagram of a first embodiment of the arrangement for stabilization of the scanning pulse period;

FIG. 4 graphs against time for explanation of the mode of operation of the arrangement as FIG. 3;

FIG. 5 the diagram of a second embodiment of the arrangement for stabilization of the scanning pulse period; and FIG. 6 graphs against time for explanation of the mode of operation of the arrangement as FIG. 5.

For better understanding of the circuit arrangement described later the principle of electronic stroboscopic scanning is first of all explained with the aid of FIGS. 1 and 2.

In the graph A of FIG. 1 signals of the same wave shape are shown, which repeat regularly at the period T. It is assumed that the repetition rate of these signals is very high, in particular considerably higher than the highest deflection frequency of the available oscillograph.

In order nevertheless to be able to make these signals visible on an oscillograph screen they are scanned periodically by scanning pulses which are illustrated in graph B. These scanning pulses have a period $T+\Delta t$ which differs by a small time difference $\Delta t$ from the period T of the signals.

By means of the scanning pulses of graph B a scanning value is derived from each of the successive signal curves from graph A, the positions of the scanning values differing from one period to the next by the amount $\Delta t$. Thus if the first scanning value coincides with the start of the signal period, the second scanning value lies after the start of the signal period by the time interval $\Delta t$, the third scanning value by $2\Delta t$ after the start of the signal period, etc.

It is to be observed that the time difference $\Delta t$ in FIG. 1 is for the sake of clarity shown greatly exaggerated; in reality this time difference is very small. It amounts, for example, to 1/10,000 of the period T, so that the successive scanning values correspond with points on the signal curve lying very close together and a correspondingly large number (for example, 10,000) of scanning pulses are necessary for the complete scanning of one complete signal period.

The scanning values obtained one after another are in each case stored until the next scanning value and reproduced on the screen of the oscillograph in the course of a single deflection of the spot of light, as is illustrated in the graph C. In reality the curve does not run continuously between the scanning values, but in the form of steps; but if the number of scanning points is adequately large and these lie close enough together, the curve is formed accurately to a close approximation.

Since the scanning points in relation to one period T of the true time signal lie at the interval apart of $\Delta t$ and in relation to the period T' of the signal image at the interval $T+\Delta t$ apart, the following holds for the number n of scanning points which are needed for a complete image of one signal period:

$$T = n.\Delta t; \; T' = n.(T+\Delta t); \; n = T/\Delta t = T'/T + \Delta t$$

The image corresponds with a time transformation having the Time transformation factor $k = T'/T = T + t/\Delta t = T/\Delta t + 1$.

Because of the time transformation it is possible to make very rapidly progressing periodical processes visible on an oscillograph that works considerably slower, provided that a sufficiently large number of signal periods is available for the scanning.

The graph D in FIG. 1 shows a known method of generation of scanning pulses, the period of which differs by a constant difference in time $\Delta t$ from a predetermined period T. For this purpose two linear sawtooth voltages $SZ_1$ and $SZ_2$ are generated with very different gradients. The sawtooth voltage $SZ_1$ has the period T and the sawtooth voltage $SZ_2$ has a very much longer period. The two sawtooth voltages are applied to the input to a comparator which at every determination of the coincidence of the rising edges triggers the generation of a scanning pulse. The graph D reveals directly that the points of coincidence in time in the successive periods of the sawtooth voltage $SZ_1$ lie respectively at interval $\Delta t$, $2\Delta t$, $3\Delta t$, etc., after the start of the period. This corresponds exactly with the desired position in time of the scanning pulses of graph B.

The graph E of FIG. 1 shows another solution for the generation of the periodical scanning pulses; this solution is the object of the older patent application Ser. No. P2729331.8. In this solution, instead of the two linear sawtooth voltages of graph D two exponentially rising sawtooth voltages $E_1$ and $E_2$ are applied to the input to the comparator which again at every coincidence of the exponentially rising edges of the two sawtooth voltages triggers the generation of a scanning pulse. The sawtooth voltage $E_1$ has again the period T, and the sawtooth voltage $E_2$ has a very much longer period. It can be proved mathematically that even in this case the points of coincidence and hence also the scanning pulses have an exactly constant period which differs by a constant time interval $\Delta t$ from the period T of the faster sawtooth. The advantage of this solution consist in the fact that in the case of the generation of exponential sawtooth voltages, with very much smaller outlay in circuitry accurate maintenance of no matter how small a time difference $\Delta t$ can be achieved with very great temperature stability.

In particular the sawtooth generators employed for the generation of the exponential sawtooth voltages may be simple RC-circuits which contain a capacitor which is connected in series with a charging resistor to a d.c. voltage and with which there is connected in parallel a periodically triggered discharge circuit.

With the aid of FIG. 2 it is to be shown how an alteration of the time difference $\Delta t$ between the signal period and the scanning pulse period affects the scanning of the signal.

In the graph A in FIG. 2 in simplified form a sequence of signals of the same wave shape is again illustrated, which are repeated regularly at the period T. The graph B shows a sequence of scanning pulses the successive period of which differs by a small difference in time $\Delta t$ from the period T of the signals. The graph C shows the time-expanded signal curve which is obtained by the periodic scanning of the signals of graph A by means of the scanning pulses of graph B. For clarity the time difference $\Delta t$ is shown greatly exaggerated, so that the number of scannings which is performed for the complete scanning of the signal wave shape is very small; in the case of the example illustrated the complete scanning of the signal curve is effected by seven scannings, and thus in the course of seven successive signal periods. As has already been explained previously, in reality the time difference $\Delta t$ is very small compared with the signal period T, so that the successive scanning values lie very close together. The reproduction of the time expanded signal curve is therefore effected in reality by a very large number of scannings which extend over a correspondingly large number of successive signal periods T.

The graph D in FIG. 2 shows the generation of the scanning pulses by the determination of the coincidences between two linear sawtooth voltages of which the one sawtooth voltage has the same period T as the signals to be scanned, whilst the other sawtooth voltage has a very much longer period.

In the graph E in FIG. 2 the signals from graph A with the successive period T are shown again. The graph F shows scanning pulses the successive period of which differs from the successive period T of the signals by a time difference $\Delta t'$, which is rather bigger than the time difference $\Delta t$ of the scanning pulses of graph B. As graph H reveals, this alteration of the successive period of the scanning pulses follows from the fact that the steepness of the rising edge of the slow sawtooth signal is somewhat increased, so that the points of coincidence in each period occur rather later than in graph D.

The graph G shows the time-expanded signal curve which is obtained by the scanning of the signals of graph E by the scanning pulses of the graph F. Because of the rather longer scanning pulse period, for the complete image of the signal curve a rather smaller number of scannings is needed; in the case of the example illustrated six scannings are necessary for the complete image of the signal curve. Thus the time-expanded signal obtained by the scanning extends over five successive periods T of the scanned signal, and no longer over six successive periods as in graph C.

Certainly the time-expanded signal from the graph G in FIG. 2, just like the time-expanded signal of graph C is also an accurate image of the scanned signal, which is the more accurate, the greater the number of scannings employed, yet the duration of the signal G is shorter by a whole successive period T than the duration of the signal C. Thus the time scale of the time expansion is different.

This alteration of the time scale is meaningless so long as it is only a matter of making the wave shape of very rapidly progressing periodic processes visible. If on the contrary time measurements are to be performed on the time-expanded signal errors in measurement are caused by these alterations of time scale.

A comparison of the graphs B and C with the graphs F and G in FIG. 2 reveals that very small alterations in the scanning pulse period produce considerable errors in measurement. An alteration of the time difference $\Delta t$, which has the result of a single scanning more or less in the image of the time-expanded signal curve, produces an error in measurement of a complete signal period T. Since the time difference $\Delta t$ in turn is only a very small fraction of the scanning pulse period $T + \Delta t$, the scanning pulse period must be kept constant with extraordinarily high accuracy if accurate time measurements are to be performed on the time-expanded signal. This stabilisation of the successive period of the scanning pulses is particularly difficult because it is a matter of extraordinarily short times; the order of magnitude of the time difference $\Delta t$ lies in the range of picoseconds. The measurement of such short times is not possible with justifiable outlay.

FIG. 3 shows a circuit arrangement which enables accurate time-stabilisation of the successive period of scanning pulses employed for electronic stroboscopic scanning.

FIG. 3 shows a signal source 10 which delivers the periodically recurring signals to be scanned. A transmission line 11 is connected to the signal source 10, over which the signals may be transmitted, for example, to a load (not shown). In the event that such a transmission line is not available anyhow, it may be provided in addition for the purpose contemplated; it is then preferably terminated to be reflection-free.

Two scanning circuits 14, 15 respectively are connected to two points 12 and 13 on the transmission line 11 which lie at an accurately defined distance $L_m$ apart, which scan the signals running over the transmission line 11 in the electronic stroboscopic way previously described. For this purpose the two scanning circuits 14 and 15 are controlled synchronously by scanning pulses which are delivered by a scanning pulse generator 16. Each scanning circuit has a signal input 17 respectively 18, which is connected to the corresponding point 12 respectively 13 on the transmission line 11, a control input 19 respectively 20, which is connected to the output from the scanning pulse generator 16, and an output 21 respectively 22. The scanning circuits are instantaneous value stores known in themselves (also called 'sample and hold') which upon a control pulse applied to the control input store the instantaneous value of the signal which is present at the signal input and retain it until the next control pulse and make it available at the output. For better understanding each scanning circuit is shown in simplified form so that it contains a storage capacitor C which via a switch S actuated by the control pulse may be connected briefly to the signal input.

At each scanning pulse the switch S is closed briefly so that the storage capacitor C adopts a charging voltage which corresponds with the instantaneous value of the signal present at the signal input; after the opening of the switch S the storage capacitor C retains this charging voltage until the next closing of the switch S. In reality the switch S is naturally an electronic switch.

If to the control input 19 of the scanning circuit 14 scanning pulses of the kind previously described are applied, the successive period of which differs from the period of the signals transmitted over the transmission line 11 by a small time interval $\Delta t$, there appears consequently at the output 21 from the scanning circuit 14 obviously a time-transformed signal which is composed of the successive scanning values of the signals scanned at the point 12. In the same way there appears at the output 22 from the scanning circuit 15 a time transform signal which is composed from the successive scanning values of the signals scanned at the point 13.

The outputs 21, 22 from the two scanning circuits 14 respectively 15 are connected to the two inputs 24 respectively 25 of a trigger circuit 23. This trigger circuit is constructed so that it responds when the signal fed to its input 24 reaches a certain amplitude value and so that it is reset again when the signal fed to the input 25 reaches the same amplitude value. It delivers at the output 26 a rectangular pulse which starts at the instant of the response and ends with resetting.

The output 26 from the trigger circuit 23 is connected to the control input 28 of a gate circuit 27 which receives at its signal input 29 signals to be counted. The output from the gate circuit 27 is connected to the counting input 31 of a digital counter 30 which can be reset to zero by a signal applied to a reset input 32. The stepped outputs 33 from the digital counter at which the state of the count at the time is available in digital form are connected to the corresponding inputs to a comparison circuit 34 which is connected at a second group of inputs to the outputs 35 from a desired value store 36. The comparison circuit has a triggering input 37 and is so constructed that it performs a comparison between the state of the count indicated at the outputs 33 from the digital counter 30 and the desired state of the count permanently available at the outputs 35 from the desired value store 36, when a triggering signal is applied to its triggering input 37; it then delivers at its output 38 a signal which indicates the deviation established between the states of the count which have been compared with one another.

The scanning pulse generator 16 is for the sake of example constructed in such a way that it generates scanning pulses in accordance with the method which was previously explained with the aid of the graph E in FIG. 1. It contains for this purpose two RC-sawtooth generators 39 and 40 which generate the sawtooth voltages having exponentially rising edges and very different periods. The RC-sawtooth generator 39 contains a capacitor 41 which is connected in series with a resistor 42 between the positive terminal $+U_B$ of a d.c. voltage source and earth, and a switch 43 lying in parallel with the capacitor 41, which is actuated periodically by a fast timing generator 44.

When the switch 43 is open, the capacitor 41 gets charged up via the resistor 42 so that its terminal voltage rises exponentially at a time-constant determined by the value of the resistance of the resistor 42 and the capacity of the capacitor 41. When the switch 43 is briefly closed, the capacitor 41 is suddenly discharged. Thus the terminal voltage of the capacitor 41 changes in accordance with the curve $E_1$ in the graph E in FIG. 1 after the fashion of a sawtooth voltage the rising edge of which has an exponential trend. The period T of this sawtooth voltage is determined by the timing generator 44 in such a way that it corresponds with the period of the signals delivered from the signal source 10; for this purpose synchronisation may be provided between the signal source 10 and the timing generator 44 as is indicated by a line of dashes.

The RC-sawtooth generator 40 is built up in exactly the same way from a capacitor 45, a resistor 46 and a switch 47 actuated by a timing generator 48. The capacity of the capacitor 45 and the value of the resistance of the resistor 46 are, however, dimensioned in such a way that the charging time constant is considerably larger than in the case of the RC-sawtooth generator 39; further, the period of actuation of the switch 47 by the timing generator 48 is considerably larger than the period T.

Thus the terminal voltage of the capacitor 45 runs to correspond with the curve $E_2$ of the graph E in FIG. 1 in the form of a sawtooth voltage having an exponentially rising edge, the gradient of which is considerably flatter than in the case of the curve $E_1$.

Again the resistor 46 of the second sawtooth generator 40 is made in such a way that it can be set by a signal applied to a control input 49. Hence by this signal the charging time constant of the second sawtooth generator and thereby the steepness of the rising edge of the sawtooth voltage may be altered.

The signal input 29 to the gate circuit 27 is connected to the output from the fast timing generator 44 so that during the time of opening of the gate circuit 27 the signals delivered by the timing generator 44 are fed to the counting input 31 to the digital counter 30 with the successive period T. The output from the slow timing generator 48 is on the one hand connected to the reset input 32 to the digital counter 30 and on the other hand to the triggering input 37 to the comparison circuit 34, so that at the end of each period of the slow timing generator the performance of the comparison is triggered and the digital counter 30 is reset to zero. The control input 49 is connected to the output 38 from the comparison circuit 34.

The terminals of the capacitors 41 and 45 are connected to the two inputs to a comparator 50 which is so constructed that at every determination of a coincidence between its two input signals it sends a triggering pulse to a scanning pulse generator 51 connected to its output. Hence at the output from the scanning pulse generator 51 there are available the scanning pulses the period of which differs by the fixed time difference $\Delta t$ from the period T of the signals passing over the transmission line 11, and which control the scanning circuits 14, 15. The same scanning pulses may be fed to further scanning circuits which are used for scanning the signals at another point.

The mode of operation of the circuit shown in FIG. 3 is to be explained with the aid of the graphs as FIG. 4, which show the course of signals with respect to time, which occur at different points in the circuit as FIG. 3. These signals are designated by the same reference numbers as the corresponding points in the circuit as FIG. 3.

The graph A in FIG. 4 shows the time-transformed signal obtained at the output 21 from the scanning circuit 14, which is composed after the fashion of a stepped curve from the successive scanning values of the signals scanned at the point of connection 12. This signal has the same wave shape as each of the signals passing over the transmission line 11, but with respect to being expanded in time by a ratio given by the time transformation factor k.

The graph B in FIG. 4 shows the time-transformed signal which is obtained at the output 22 from the scanning circuit 15. This signal corresponds with the signal 21 and is composed of the scanning values which are derived at the point of connection 13 from the signals passing over the lead 11. The signal 22 is delayed with respect to the signal 21 by an interval of time $t'_m$ which corresponds with the transit time $t_m$ of the signals from the point of connection 12 to the point of connection 13, multiplied by the time transformation factor k.

The distance $L_m$ between the points of connection 12 and 13 defines an accurately fixed measuring section; if the propagation speed v of the signals over the transmission line 11 is known, the true transit time of the signals between the points of connection 12 and 13 can be calculated:

$$t_m = L_m/v$$

The time interval $t'_m$ between the two time transformed signals 21 and 22 is expanded compared with the transit time $t_m$ by the time transformation factor k:

$$t'_m = k \cdot t_m = T + \Delta t/\Delta t \cdot t_m$$

For scanning the section of signal corresponding with the traverse of the measuring section, $n_m$ scanning points are needed, which are given by the following equation:

$$n_m = t_m/\Delta t$$

The same number $n_m$ of scanning points must naturally be present in the time interval $t'_m$ obtained by the scanning, which corresponds with the time interval between the time transformed signals 21 and 22. This follows from the equation:

$$n_m = \frac{t_m'}{T + \Delta t} = \frac{k \cdot t_m}{T + \Delta t} = \frac{t_m}{\Delta t}$$

Hence with a known and fixed transit time $t_m$ of the signals over the measuring section of length $L_m$ a clear connection exists between the number $n_m$ of scanning points which come in the time interval $t'_m$, and the difference in time $\Delta t$ by which the scanning pulse period differs from the signal period. This fact is made use of in the circuit arrangement as FIG. 3 for regulation of the scanning pulse period.

The trigger circuit 23 is triggered when the time transformed signal 21 reaches a certain value of amplitude and it is reset when the time transformed signal 22 reaches the same value of amplitude. Hence at the output from the trigger circuit 23 there appears the rectangular pulse 26 shown in FIG. 4, the duration of which, as may be seen directly, corresponds exactly to the interval of time $t'_m$.

The rectangular pulse 26 determines the time of opening of the gate circuit 27. Hence the output pulses from the fast timing generator 44 are fed to the digital counter 30 during a measuring time interval of duration $t'_m$.

Since for each output pulse of the fast timing generator 44 a scanning pulse is generated, the number of pulses counted by the digital counter 30 during the measuring time $t'_m$ corresponds with the number of scannings of the signals passing over the lead 11, which are performed during the measuring time $t'_m$.

Hence when the digital counter 30 at the end of the measuring time $t'_m$ reaches a state of the count which corresponds exactly with the previously calculated number $n_m$ of scannings, this is a sign that the time difference $\Delta t$ has exactly the prescribed value.

In order that it may be established whether this condition has been fulfilled, a state of the count is stored in the desired value store 36, which corresponds with the number $n_m$ of scanning points. The comparison circuit 34 compares this stored desired value $n_m$ with the actual value established by the digital counter 30 at the end of the measuring time $t'_m$. If these two values agree, the comparison circuit 34 emits no output signal and the setting of the timing pulse generator 16 remains unaltered.

If on the contrary the comparison circuit 34 establishes a difference between the desired value $n_m$ and the actual value counted by the digital counter 30, it delivers an output signal which indicates the deviation in magnitude and direction. This output signal is applied to the control input 49 and acts upon the resistor 46 of the slow sawtooth generator 40. By alteration of this resistor the time constant of the slow sawtooth generator 40 and hence the scanning pulse period is altered. This alteration is effected in the direction of a reduction of the output signal from the comparison circuit 34.

The same process is repeated after each period of the slow timing generator 48 until the output signal from the comparison circuit 34 has become zero. Continuous regulation of the scanning pulse period is thereby effected, by which the time difference $\Delta t$ is held to the predetermined value.

In the case of the circuit arrangement as FIG. 3 the counting of the scanning points is effected in the digital counter 30 by the counting of the output signals from the fast timing generator 44. But other signals could also be counted, the number of which coincides with the number of scanning points. There are, for example, the timing pulses themselves emitted at the output from the timing pulse generator 16, or even the signals transmitted over the signal lead 11 since in every period of these signals one scanning is effected.

The particular advantage of the regulation performed by the circuit as FIG. 3 consists in the fact that the measurement of time is performed upon the time transformed signals, so that neither the very short true transit time of the signals over the measuring section nor the still very much shorter time difference $\Delta t$ themselves have to be measured. Again the formation of the regulating signal is effected by digital counting of signals which are present in the system and the period of which is likewise very large compared with the time difference to be regulated. It is thereby possible to keep time differences $\Delta t$ which are of the order of magnitude of picoseconds, constant with very high accuracy.

In the case of the circuit arrangement as FIG. 3 the measuring section $L_m$ is defined by the distance along the signal lead 11 between the points of connection 12 and 13 of the two scanning circuits 14 and 15. But the measuring section can also be fixed in other ways on the signal lead 1, in which case it is then possible to manage with a single scanning circuit.

FIG. 5 shows a modified embodiment of the circuit in which use is made of this possibility.

The circuit arrangement as FIG. 5 contains again part of the components of the circuit arrangement as FIG. 3 in an unaltered form; these components are designated by the same reference numbers as in FIG. 3.

On the other hand in the case of the arrangement as FIG. 5 a section of lead 60 is inserted in the transmission line 11, the characteristic impedance $Z_m$ of which differs from the characteristic impedance $Z_O$ of the signal lead 11, so that a break in the impedance exists at the input 61 to the measuring section and at the output 62 from the measuring section. The section of lead 60 forms the measuring section having the length $L_m$. To a point of connection 63 lying between the signal source 10 and the input 61 to the measuring section there is connected a scanning circuit 64 which has the same construction and the same mode of operation as the scanning circuits 14 and 15 explained with the aid of FIG. 3. The signal input 65 to the scanning circuit 64 is connected to the point of connection 63, the control input 66 receives the scanning pulses emitted by the timing pulse generator 16, and the output 67 from the scanning circuits 64 is connected to the input to a trigger circuit 68. The output from the trigger circuit 68 is connected to the control input 28 to the gate circuit 27.

The mode of operation of this circuit insofar as it differs from the previously explained mode of operation of the circuit as FIG. 3, is to be explained by reference to the graphs of FIG. 6.

Because of the breaks in the impedance, in each case part of the signal is reflected at the input 61 and at the output 62 of the measuring section 60, and this reflected part of the signal runs over the lead 11 from the measuring section 60 back to the signal source 10. Besides the signals transmitted in the forwards direction, the scanning circuit 64 connected to the point of connection 63 scans the reflected parts of the signals too. Depending upon the ratio between the duration $T_s$ of the signal and the transit time $t_m$ over the measuring section and the ratio of the characteristic impedance $Z_m$ of the measuring section 60 to the characteristic impedance $Z_O$ of the lead different possibilities arise which are illustrated in the graphs of FIG. 6.

The graphs A to D of FIG. 6 show the time-transformed signal obtained at the output from the scanning circuit 64; it is to be observed that these signals apart from the changed time-scale have the same shape as the signals running over the signal lead 11.

The graph A shows the conditions for the case where the duration $T_s$ of the signal is less than the transit time $t_m$ over the measuring section, and where the characteristic impedance $Z_m$ of the measuring section is greater than the characteristic impedance $Z_O$ of the lead. The scanning circuit 64 connected to the point of connection 63 first of all scans the direct pulse $I_d$ of duration $T_s$ transmitted from the signal source 10 over the transmission line 11. At the output from the scanning circuit a corresponding time-transformed pulse of duration $T'_s$ is obtained.

When the pulse $I_d$ arrives at the input 61 to the measuring section, part of it is reflected in the form of a pulse $I_{r1}$, which runs back to the signal source 10 and after a certain time delay which depends upon the distance between the point of connection 63 and the input 61 to the measuring section, gets scanned at the point of connection 63 and consequently appears with the corresponding time-transformation in the output signal from the scanning circuit. Since the characteristic impedance $Z_m$ of the measuring section 60 is greater than the characteristic impedance $Z_O$ of the lead, the pulse $I_{r1}$ reflected at the point 61 has the same polarity as the direct pulse $I_d$.

When the direct pulse $I_d$ running over the lead 11 arrives at the output 62 from the measuring section another reflection takes place, in which case the pulse $I_{r2}$ now obtained by the reflection has the opposite polarity. The second reflected pulse $I_{r2}$ runs back over the measuring section and likewise gets scanned at the point of connection 63.

It can be seen directly that the time interval between the two reflected pulses arriving at the point of connection 63 is a measure of the transit time of the pulses over the measuring section 60. Moreover it is to be observed that in this case the time interval corresponds with transit over the measuring section 60 twice. Hence for the transit time $t_m$ of the pulses over the measuring section 60 the following equation holds:

$$t_m = 2L_m/v$$

where v is the propagation speed of the signal over the lead 11.

From that there results in the time-transformed signal the time-transformed measuring time $t'_m$ which is expanded by the time-transformation factor k with respect to the time of transit $t_m$. In the same way as in the circuit arrangement as FIG. 3 the number $n_m$ of scanning points can again be calculated, which are needed for the scanning of the section of signal corresponding with the time interval between the two reflected signals:

$$n_m = t_m/\Delta t$$

Hence by counting the scanning points contained in the measuring time $t'_m$ the regulation of the scanning pulse period can again be effected in the same way as with the circuit as FIG. 3.

For this purpose the trigger circuit 68 of the circuit as FIG. 5 must be made in such a way that it delivers an output pulse the duration of which is the same as the interval of time between the two reflected pulses $I_{r1}$ and $I_{r2}$.

For this purpose, it can for example, be made in such a way that it is triggered by the front edge of the pulse $I_{r1}$ and reset by the front edge of the pulse $I_{r2}$. There is then obtained at the control input 28 to the gate circuit 27 the control pulse shown in graph E of FIG. 6, which has the duration $t'_m$. The digital counter 30 then counts the pulses emitted by the fast timing generator 44 in the time interval $t'_m$, and the regulation can be effected on the basis of the state of the count established in the same way as with the circuit as FIG. 3, provided that in the desired value store 36 a desired value $n_m$ is stored, which corresponds not with the single but with the double traverse of the measuring section $L_m$.

The trigger circuit 68 naturally does not have to respond to the direct pulse $I_d$; this can be achieved by suitable measures, for example, by an additional release circuit 69 which is excited by the output signal from the slow timing generator 48 and releases the trigger circuit 68 only with a certain delay after the start of each measuring period.

The graph B of FIG. 6 is valid for the case where the signal duration $T_s$ as in the graph A is less than the transit time $t_m$ but where the characteristic impedance $Z_m$ of the measuring section is less than the characteristic impedance $Z_O$ of the lead. The sole difference then consists in the fact that now the first reflected pulse $I_{r1}$ has the opposite polarity, whilst the second reflected pulse $I_{r2}$ has the same polarity as the direct pulse $I_d$.

The graphs C and D of FIG. 6 are valid for the case where the signal duration $T_s$ is considerably greater than the transit time $t_m$ of the signals over the measuring section. In this case at the point of connection 63 the reflected signals are superimposed upon the direct signal still in transmission. In the case where the characteristic impedance $Z_m$ of the measuring section is greater than the characteristic impedance $Z_O$ of the lead, a transient increase in amplitude (graph C) thereby occurs in the signal scanned at the point of connection 63, which in the time transformed signal has the duration $t'_m$. When the characteristic impedance $Z_m$ of the measuring section is less than the characteristic impedance $Z_O$ of the lead, the amplitude of the scanned signal is temporarily reduced by the reflected signal (graph D). This section too of reduced amplitude has again in the time-transformed signal the duration $t'_m$.

In any case the regulation of the scanning pulse period can be effected in the way previously described, provided that the trigger circuit 68 is made in such a way that in each case it measures the time interval between the alterations in signal caused by the reflections at the input and at the output of the measuring section 60 and delivers to the control input 28 to the gate circuit 27 a control signal the duration of which corresponds with this time interval. The construction of such trigger circuits or other time measuring arrangements which can perform the same function lies within the province of those skilled in the art.

FIG. 5 shows further a preferred measure for setting the resistor 46 which determines the charging time constant of the slow sawtooth generator 40. This resistor is formed by a number of part resistors 46a, 46b, . . . 46n connected in series, and a switch 70a, 70b, . . . 70n is connected in parallel with each of these part resistors. These switches which in reality are naturally electronic switches may be controlled directly by the binary output signals at the stepped outputs 38a, 38b, . . . 38n from the comparison circuit 34. With suitable gradation of the n part resistors, setting of the whole resistor in steps is thereby possible in $2^n - 1$ steps.

We claim:

1. A method of time-stabilization of periodic scanning pulses for the electronic stroboscopic scanning of periodically recurring signals, where the scanning pulse period differs from the signal period by a fixed small difference in time, characterized in that the periodically recurring signals are transmitted over a transmission line in which is inserted a measuring section of known length, that the signals transmitted over the transmission line are scanned stroboscopically by means of the scanning pulses, that the number of scans during the part corresponding with the traverse of the measuring section, of the time-transformed signals obtained by the scanning is counted and compared with a given desired value and that the scanning pulse period is regulated in the direction of elimination of the deviations from a predetermined result of comparison.

2. An arrangement for the performance of a method of time-stabilization of periodic scanning pulses for the electronic stroboscopic scanning of periodically recurring signals, where the scanning pulse period differs from the signal period by a fixed small difference in time, characterized in that the periodically recurring signals are transmitted over a transmission line in which is inserted a measuring section of known length, that the signals transmitted over the transmission line are scanned stroboscopically by means of the scanning pulses, that the number of scans during the part corresponding with the traverse of the measuring section, of the time-transformed signals obtained by the scanning is counted and compared with a given desired value, and that the scanning pulse period is regulated in the direction of elimination of the deviations from a predetermined result of comparison, having a scanning pulse generator which exhibits a control input for setting the scanning pulse period, and having a transmission line over which the periodically recurring signals to be scanned are transmitted, characterized by two storing scanning circuits which are controlled synchronously by the scanning pulses and are coupled to two points on the transmission line, the separation of which corresponds with the length of the measuring section, a time measuring arrangement connected to the outputs from the two scanning circuits, which delivers an output signal which corresponds with the time interval between two points corresponding with one another in the time-expanded output signals from the two scanning circuits (measuring time interval), a counting arrangement which receives signals at its counting input, which are in time-relationship with the scanning pulses and which are controlled by the output signal from the time measuring arrangement in such a way that it counts these signals during the duration of the measuring time interval, and by a comparison arrangement which compares the state of the count reached by the counting arrangement at the end of the measuring time interval with a desired value and delivers a regulating signal dependent upon the deviation, which is fed to the control input to the scanning pulse generator.

3. An arrangement for the performance of a method of time-stabilization of periodic scanning pulses for the electronic stroboscopic scanning of periodically recurring signals, where the scanning pulse period differs from the signal period by a fixed small difference in time, characterized in that the periodically recurring signals are transmitted over a transmission line in which is inserted a measuring section of known length, that the signals transmitted over the transmission line are scanned stroboscopically by means of the scanning pulses, that the number of scans during the part corresponding with the traverse of the measuring section, of the time-transformed signals obtained by the scanning is counted and compared with a given desired value, and that the scanning pulse period is regulated in the direction of elimination of the deviations from a predetermined result of comparison, having a scanning pulse generator which exhibits a control input for setting the scanning pulse period, and having a transmission line over which the periodically recurring signals to be scanned are transmitted, characterized by a section of line inserted into the transmission line to form the measuring section, the characteristic impedance of which is different from the characteristic impedance of the transmission line, a storing scanning circuit controlled by the scanning pulses, which is coupled to the transmission line at a point lying before the measuring section, a time measuring arrangement connected to the output from the scanning circuit, which delivers an output signal which corresponds with the time interval between the alterations in the signal (measuring time interval), generated in the time-expanded output signal from the scanning circuit by the reflections at the breaks in the characteristic impedance, a counting arrangement which receives signals at its counting input, which are in time-relationship with the scanning pulses and which are controlled by the output signal from the time measuring arrangement in such a way that it counts these signals during the duration of the measuring time interval, and by a comparison arrangement which compares the state of the count reached by the counting arrangement at the end of the measuring time interval with a desired value and delivers a regulating signal dependent upon the deviation, which is fed to the control input to the scanning pulse generator.

4. An arrangement as in claim 2, characterized in that the time measuring arrangement contains a trigger circuit which is triggered by one edge of the output signal from the one scanning circuit and is reset by the corresponding edge of the output signal from the other scanning circuit, and which delivers an output pulse the duration of which corresponds with the time interval between triggering and resetting.

5. An arrangement as in claim 3, characterized in that the time measuring arrangement contains a trigger circuit which is triggered by one edge generated because of the reflection at the input to the measuring section, of the reflected section of signal contained in the output signal from the scanning circuit, and reset by one edge of this section of signal, generated because of the reflection at the output from the measuring section, and which delivers an output pulse the duration of which corresponds with the time interval between triggering and resetting.

6. An arrangement as in claim 4 or 5, characterized in that the counting arrangement contains a digital counter the counting input to which is connected to the output from a gate circuit which receives at its signal input the signals to be counted and the control input to which is connected to the output from the trigger circuit.

7. An arrangement as in one of the claims 2 or 3, in which the scanning pulse generator contains two sawtooth generators of which the one sawtooth generator generates a fast sawtooth signal which repeats with the signal period and the other sawtooth generator generates a slow sawtooth signal with a very much longer period, as well as a comparator the inputs to which are connected to the outputs from the two sawtooth generators and which at each determination of an amplitude equality of the two sawtooth signals triggers the generation of a scanning pulse, characterized in that the sawtooth generator generating the slow sawtooth signal exhibits a control input for the setting of the steepness of edge of the slow sawtooth signal, and that the regulating signal emitted by the comparison arrangement is applied to the control input to the slow sawtooth signal generator.

8. An arrangement as in claim 7, characterized in that the sawtooth generators are RC sawtooth generators having different time constants, each of which contains a capacitor which is connected in series with a charging resistor to a d.c. voltage and with which a periodically triggered discharge circuit is connected in parallel, and that the charging resistor of the slow RC sawtooth generator can be altered by the regulating signal applied to the control input.

9. An arrangement as in claim 7, characterized in that the counting arrangement has a reset input which is connected to the output from the slow sawtooth signal generator for resetting at the end of each sawtooth signal period.

10. An arrangement as in claim 7, characterized in that the comparison arrangement has a triggering input which is connected to the output from the slow sawtooth generator for triggering the comparison at the end of each sawtooth signal period.

11. An arrangement as in claim 7, characterized in that the counting input to the counting arrangement is connected to the output from the fast sawtooth signal generator.

12. An arrangement as in claims 2 or 3, characterized in that the counting input to the counting arrangement is connected to the output from the scanning pulse generator.

13. An arrangement as in claims 2 or 3, characterized in that the signals to be scanned are applied to the counting input to the counting arrangement.

* * * * *